United States Patent [19]

Wurst et al.

[11] Patent Number: 4,963,069

[45] Date of Patent: Oct. 16, 1990

[54] CONTAINER FOR THE HANDLING OF SEMICONDUCTOR DEVICES AND PROCESS FOR PARTICLE-FREE TRANSFER

[75] Inventors: Manfred P. Wurst, Stuttgart; Rudolf Simon, Korntal-Muenchingen; Thomas V. Kahlden, Stuttgart, all of Fed. Rep. of Germany

[73] Assignee: Meissner & Wurst GmbH & Co., Stuttgart, Fed. Rep. of Germany

[21] Appl. No.: 117,737

[22] Filed: Nov. 6, 1987

[30] Foreign Application Priority Data

Nov. 6, 1986 [DE] Fed. Rep. of Germany ....... 3637880

[51] Int. Cl.⁵ .................... B65D 88/74; H01L 21/68
[52] U.S. Cl. ................................ 414/416; 55/385.1; 55/473; 98/115.3
[58] Field of Search ............... 414/217, 331, 417, 416, 414/419–422; 206/333, 334; 98/115.3; 55/385.1, 473

[56] References Cited

U.S. PATENT DOCUMENTS

| | | | |
|---|---|---|---|
| 3,923,191 | 12/1975 | Johnson | 206/334 X |
| 4,205,121 | 5/1980 | Naitoh | 206/333 X |
| 4,506,455 | 3/1985 | Rossi | 414/331 X |
| 4,534,389 | 8/1985 | Tullis | 414/217 X |
| 4,636,128 | 1/1987 | Millis et al. | 414/217 |
| 4,649,830 | 3/1987 | Tanaka | 414/217 X |
| 4,666,479 | 5/1987 | Shoji | 55/385.1 X |
| 4,678,390 | 7/1987 | Bonneton et al. | 414/331 X |
| 4,684,021 | 8/1987 | Niebling et al. | 206/334 |
| 4,701,096 | 10/1987 | Fisher, Jr. | 414/331 X |
| 4,724,874 | 2/1988 | Parikh et al. | 414/217 X |
| 4,744,715 | 5/1988 | Kawabata | 414/331 |
| 4,770,680 | 9/1988 | Machida et al. | 98/115.3 X |
| 4,778,331 | 10/1988 | Kimata et al. | 414/417 X |
| 4,867,629 | 9/1989 | Iwosawa et al. | 414/331 |

FOREIGN PATENT DOCUMENTS 134238 10/1980 Japan .................................. 98/115.3

Primary Examiner—David A. Bucci
Attorney, Agent, or Firm—Foley & Lardner, Schwartz, Jeffery, Schwaab, Mack, Blumenthal & Evans

[57] ABSTRACT

The container and transfer process are intended to prevent stop contamination of semiconductor devices from occurring, even if the container is stored or handled under unclean room conditions. The semiconductor devices are subjected to an approximately laminar clean air stream passing around them in a clean air zone. A higher static pressure is maintained in the clean air zone than in the surrounding space which might be polluted with an inadmissibly high number of particles. The clean air stream carries along any dirt particles there may still be, so that they cannot settle on the semiconductor devices. Owing to the higher static pressure, a forced flow from the clean air zone of the higher static pressure outwards into the surrounding space is achieved, thus preventing an ingress of dirt particles from the surrounding space.

15 Claims, 6 Drawing Sheets

CONTAINER FOR THE HANDLING OF SEMICONDUCTOR DEVICES AND PROCESS FOR PARTICLE-FREE TRANSFER

BACKGROUND OF THE INVENTION

The invention relates to a container for the handling of semiconductor devices, and a process for particle-free transfer.

A container is known in which semiconductor slices, so-called wafers, are transported from one clean space into another clean space. The semiconductor wafers are used for the production of microchips and may only be processed in extremely clean rooms. Care must therefore be taken that these semiconductor wafers are not contaminated during transit. For this reason, the clean space is entirely enclosed in the case of the known container. The bottom of this container is removable, so that the carrier with the semiconductor wafers can be introduced into the clean space of the container or can be taken out of it. This container can only be opened under clean room conditions, as otherwise dirt particles immediately reach the semiconductor wafers and may settle on them. A considerable effort is necessary for the airtight closure of this container. In addition, there is the risk that the closure can become damaged so that dirt particles or dust particles reach the clean space and contaminate the semiconductor wafers. The air still in the clean space also has dust particles and dirt particles in it even with extreme purity, so that there is the risk that these dirt particles will reach the semiconductor wafers even with a satisfactory closure. The chemicals used in semiconductor processing develop gases which, if contained for prolonged periods in the enclosed clean space, may enrich to such an extent that they adversely change the surface of the semiconductor wafers.

Concerning the particle-free transfer of semiconductor wafers, it is known to connect the airtight closed container to the wall of a separate loading station and then to open the bottom of the container. However, in so doing care must be taken that no dirt particles can pass into the container and/or the loading station from the surrounding air polluted with dirt particles. Consequently, the area of the container connected to the loading station must be sealed off, in an elaborate way, with seals and the like. As a result, however, there is the risk that the seal is faulty or not correctly fitted, in which event the dirt particles can pass from the surrounding air through the untight sealing point into the container and/or the loading station.

SUMMARY OF THE INVENTION

An objective of the invention is to design a container of the generic type, and a corresponding handling process, in such a way that, with simplest structural design, no contamination occurs in the clean air zone, even if the container is stored or handled under unclean room conditions. In particular, it is intended to ensure, without great structural expenditure, in the critical transfer between two clean air zones that no dirt particles reach the clean air zones from the surrounding space.

The semiconductor devices in the clean air zone of the container according to the invention constantly have the directed clean air stream passing around them, so that any dirt particles or dust particles carried along by this air stream cannot settle on the semiconductor devices. Since the semiconductor devices constantly have the clean air stream flowing around them, the gases forming are taken along by the flow, so that they cannot attack the surface of the semi-conductor devices. In addition, the semiconductor devices can also be stored for a lengthy period of time, without fear of damage, since during storage the semiconductor devices likewise constantly have the clean air stream passing around them. Owing to this clean air stream, access of the surrounding air to the clean air zone of the container according to the invention is reliably prevented. Consequently, the container according to the invention can also be transported through contaminated rooms, without the risk that dirt particles reach the clean air zone. Since the container does not have any seals, the disadvantages associated with seals do not exist. In addition, the carrier with the semiconductor devices is easily accessible, so that the further handling of the container according to the invention can be carried out fully automatically without any trouble.

In the case of the process according to the invention, the particle-free transfer of the products can be carried out without the critical transfer zone having to be sealed off from the surrounding space by separate sealing elements and the like. Since both clean air zones have the clean air flowing through them and at least in the one clean air zone there prevails a higher static pressure than in the surrounding space, a forced flow from the clean air zone along the rim of the respective transfer opening to the outside is achieved, and an ingress of dirt particles from the surrounding space is reliably prevented. Thus, no mechanical sealing elements and the like are necessary in the case of the process according to the invention.

Further features of the invention will be apparent from the description which follows.

BRIEF DESCRIPTION OF THE APPLICATION DRAWINGS

The invention is explained in more detail with reference to two exemplary embodiments represented in the drawings, in which FIG. 1 shows, in elevation and diagrammatic representation, a first embodiment of a container according to the invention;

DETAILED DESCRIPTION OF THE PREFERRED EMBODIMENTS

Carriers 1 are transported with the container, with semiconductor slices 2, so-called wafers, being arranged in and supported by the carrier. These semiconductor wafers 2 are used for the production of microchips. The semiconductor wafers 2 may only be handled and transported in extremely clean rooms, because even minute dirt or dust particles make the semiconductor wafers unusable for further processing.

Figure 1:
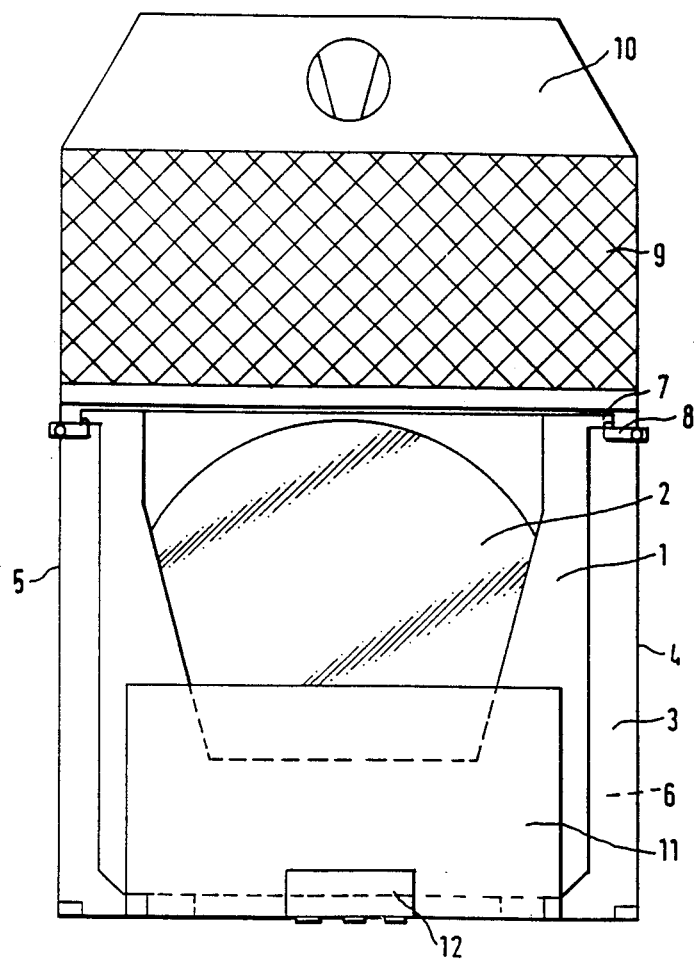

The container according to FIG. 1 has a rectangular plan outline with four side walls, one of which is the front wall 3 and two of which are mutually opposite side walls 4 and 5 are shown in FIG. 1. In the clean space 6 enclosed by the walls, the carrier 1 is mounted in suspended manner. For this, it is provided at its upper end with a flange-like extension 7, which interacts with catches 8 which are provided on the inside of the side walls of the container. Clip connections or the like could also be used. The clean space 6 is closed at the top by at least one high efficiency suspended substance filter 9, above which a fan unit 10 is arranged. The fan takes in air from the surrounding space, which then flows through the filter 9. It filters out the dust and dirt particles contained in the air, so that clean air flows into the underlying clean space 6. In the exemplary embodiment according to FIG. 1, the clean air is directed to flow from top to bottom, flowing evenly through the clean space 6 over its entire cross-section in a direction which is approximately laminar. The semiconductor wafers 6 are arranged upright in the carrier 1, so that the clean air flows downwardly over the sides of all semi-conductor wafers 2.

The container is open on the side opposite the fan unit 10, the bottom as shown in FIG. 1, so that the clean air flowing approximately laminarly downwards flows out of the clean space 6 at the open end.

The fan unit 10 may also be arranged on a side wall of the container, so that the clean air flows horizontally through the clean space 6. In this case, the container is open on the side opposite to the fan, and the bottom of the container is closed. The semiconductor wafers 2 then lie in or parallel to the flow direction, so that the clean air can flow by them.

Depending on the degree of purity desired, a corresponding high efficiency suspended filter 9 is used. In this manner, the air entering the clean space 6 has the desired degree of purity. This directed laminar flow has the effect of carrying along any particles that may be in the clean space 6 and passing such particles to the outside. The particles thus cannot settle on the semiconductor wafers 2. Owing to this flow, the container can be transported without any risk even through rooms of lower purity class, in which there may thus also be a relatively high number of dirt or dust particles. The directed flow in clean space 6 always prevents any dirt or dust particles from passing into the container and being able to settle on the semiconductor wafers 2.

In semiconductor processing, chemicals are used which result in the formation of gas. Since the semiconductor wafers 2 constantly have clean air flowing around them, these gases forming are removed by the air flow so that they cannot attack the surface of the semiconductor wafers.

For operation of the fan unit 10, the container is equipped with at least one accumulator 11, or a battery, by which the fan unit can be driven. If the container is at an unloading or loading point or at a storage point, it is connected to the power line or to a larger accumulator. For this, the container is provided with a connection 12 or with an interface, so that the fan unit 10 can then be supplied externally with the necessary power. At the same time, the accumulator 11 is thereby charged.

The flow velocity in the clean space 6 of the container is chosen such that no air can pass into the clean space from outside during normal handling. The flow velocity is expediently approximately 0.45 m/sec. This flow velocity has been found appropriate in the case of large clean rooms. Owing to this flow velocity, a slight dynamic pressure forms in the clean space 6, relative to the pressure in the contaminated surrounding space.

To increase the static positive pressure, it is expedient to provide a perforated plate on the underside of the container at the outlet end of the clean air. The positive pressure is then of an order of magnitude of approximately 1 Pa. The perforated sheet only slightly impairs the uniformity of the directed flow in the clean space 6.

The container according to FIG. 1 is of low weight and can consequently be transported comfortably by hand. The loading of the container with the carrier 1 and the semiconductor wafers 2 is performed under conditions appropriate for a clean room. If the container is transported by hand, the fan unit 10 is operated by means of the internal accumulator 11, so that clean air constantly flows outwards past the semiconductor wafers 2. The container serves the purpose of transporting the semiconductor wafers 2 from the loading point, for example, to a process apparatus 13 (FIG. 2), in which the semiconductor wafers are further processed. The container with the carrier 1 and semiconductor wafers 2 is removed at the process apparatus 13 under conditions appropriate for a clean room, so that the purity conditions which prevail in the container are not worsened during the removal operation. This removal operation is consequently performed either in the clean room or at or in the process apparatus 13. In the exemplary embodiment, the process apparatus 13 has an unloading space 14, which has clean air flowing through it from top to bottom, approximately laminarly. This unloading space 14 is covered at the top by at least one high efficiency suspended substance filter 15, above which there is a fan unit 16. The fan takes in air from the surrounding space and forces the air through the filter 15, which filters out the dirt and dust particles. The filter 15 is selected in accordance with the purity conditions required.

When unloading the container, the carrier 1 with the semiconductor wafers 2 continues to have clean air passing around it laminarly, so that no dirt or dust particles can settle on them. Since there is such a laminar flow in the unloading space 14 as well, the depositing of such contaminants on the semiconductor wafers 2 can also be reliably prevented here as well in a very simple way.

When the container is at or in the process apparatus 13, the fan unit 10 is driven by the power supply of the process apparatus 13, via the connection 12, and at the same time the internal accumulator 11 of the container is charged.

Since the container is open on one side, the carrier 1 with the semiconductor wafers 2 can be removed from the clean space 6 in a simple way.

An embodiment is also possible in which the container does not have any side walls bounding the clean space 6. The carrier in this embodiment is suspended on a holder located underneath or next to the filter 9. The air stream generated by the fan 10 similarly passes around the semiconductor wafers 2 and prevents the access of dirt particles from the surrounding air to the surfaces of the wafers.

Figure 3:
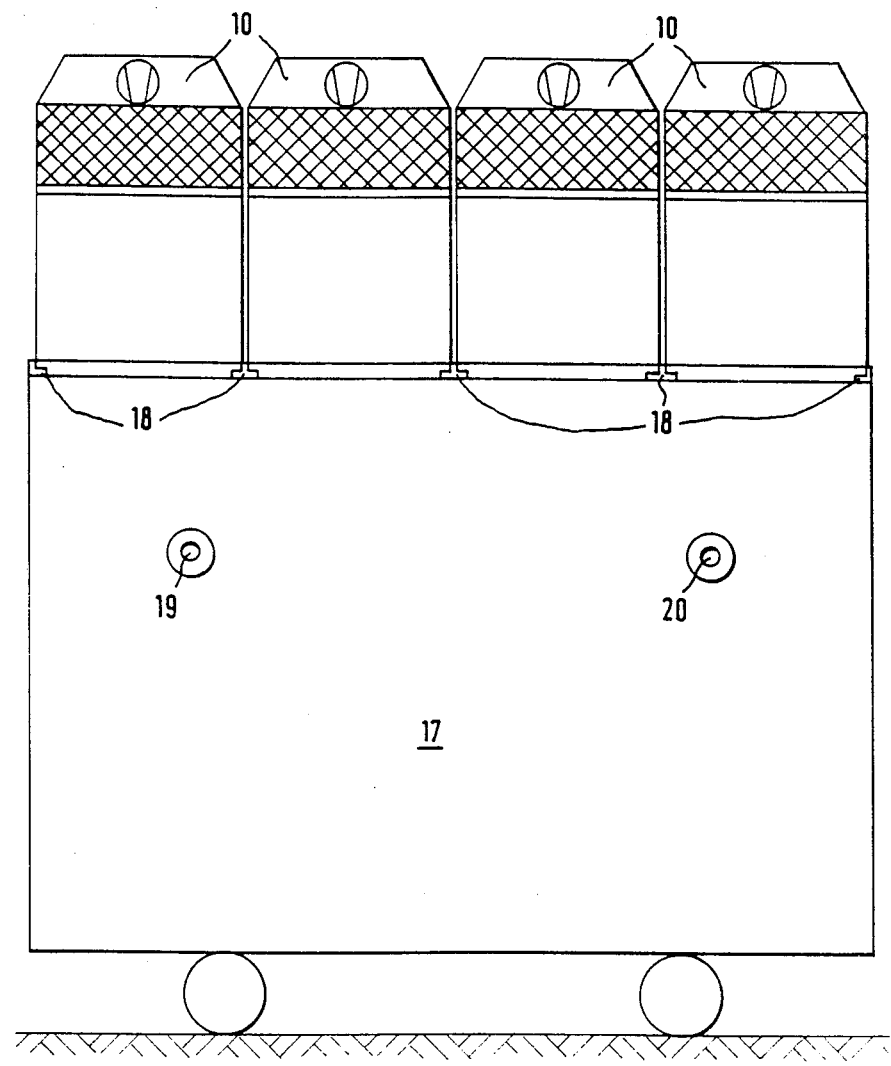
FIG. 3 shows several containers according to the invention arranged on a transport carriage.

The carrier 1 may have different sizes, depending on the size of the semiconductor wafers 2 to be transported. In the case of larger carriers 1, the container may have a higher weight, so that it is difficult to transport the container by hand. In such event, a transport carriage 17 is provided (FIG. 3), on which the containers can be positioned. Several containers are positioned on the carriage 17 in the FIG. 3 showing. In order that the air leaving the containers downwards from the clean space 6 is not diverted back into the clean space, the containers stand on supports, not shown in more detail, so that the directed flow can leave the containers downwards out of the clean space. On the transport carriage 17 there are bearings 18, on which the containers rest. These bearings may be designed as roller bearings or as air bearings, whereby the containers can be shifted from the transport carriage onto, for example, the process apparatus 13. The transport carriage 17 is provided with a connection 19 for the power supply and with a connection 20 for a vertical adjustment at least of the support surface for the containers The containers can be taken to the process apparatus 13 on the transport carriage 17. During the trip on the transport carriage 17, the fan units 10 of the containers are connected to the power supply of the transport carriage, it being possible at the same time for the accumulators 11 of the containers to be charged via this power supply. This ensures that the containers operate reliably during transit on the carriage 17 and that the downwardly directed laminar flow takes place in the respective clean spaces 6.

Figure 2:
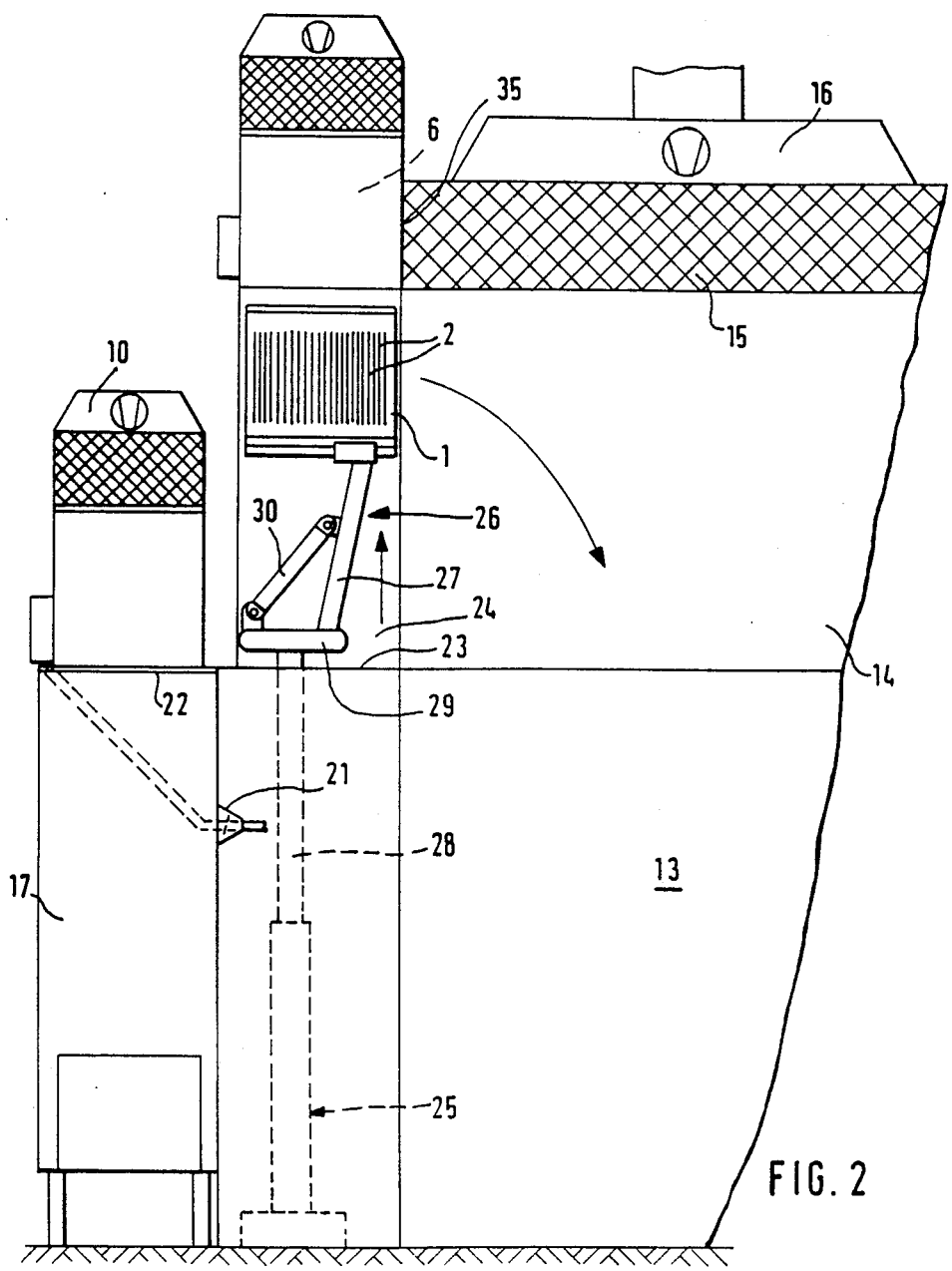
FIG. 2 shows the loading operation of a process apparatus with carrier accommodated in a container according to FIG. 1.

The transport carriage 17 is adapted to be connected to the process apparatus 13, as FIG. 2 shows. For this, the process apparatus 13 is provided with a connection 21, to which the transport carriage 17 is connected for the power supply. In this case, the containers on the transport carriage are also supplied with the necessary power to drive the fan units 10. In addition, the connection 20 of the transport carriage 17 is connected to a corresponding connection (not shown) of the process apparatus 13, so that, in the position represented in FIG. 2, the support surface provided by the bearings 18 can be vertically adjusted. Consequently, the bearing surface 22 can be made to match the bearing surface 23 of the process apparatus 13, such that the containers can be shifted from the transport carriage onto the process apparatus without difficulties.

At the transfer point or area 24 of the process apparatus 13 there is at least one lifting device 25, by which the carriers 1 of the containers, with the inserted semiconductor wafers 2, can be taken out of the container and transported into the process apparatus 13.

The containers shifted into the transfer point 24 are raised into the position represented in FIG. 2. Subsequently, the lifting device is used to move up a gripping unit 26, the grippers 27 of which enter the clean space 6 of the respective container and grasp the carrier 1 kept there With the grippers 27, the carrier 1 is then released from the catches 8 and lowered downwards into the position represented in FIG. 2. In so doing, the entire gripping unit 26 is lowered by means of the lifting device 25. On the piston rod 28 of the lifting device 25 there is a mounting plate 29, on which the grippers 27 are pivotally mounted. The pivoting of the grippers 27 is served by a piston-cylinder unit 30, which is likewise pivoted on the bearing plate 29 and hinge-connected to the grippers 26. When the gripping unit 26 has been lowered into the position represented in FIG. 2, the piston-cylinder unit 30 is actuated and the grippers 26 are pivoted clockwise (see arrow in FIG. 2) with the carriers 1 and brought into the unloading space 14 of the process apparatus 13. In the unloading space 14, the carrier 1 is then set down. The grippers 27 are swung back again and the gripping unit 26 is lowered by the lifting device 25 underneath the bearing surface 23.

During the transfer operation described, clean air flows out of the respective container and also downwardly through the discharge space 14 of the process apparatus 13, so that the semiconductor wafers 2 in the carrier 1 constantly have clean air passing around them. This ensures that no dirt particles or dust particles can settle on the semiconductor wafers during this transfer operation.

In the unloading space 14, which represents a clean space, the bearing surface for the carriers 1 may be formed by a perforated plate, a grid or some other air-permeable supporting part. With this, the necessary positive pressure in the unloading space 14, relative to the pressure in the contaminated surrounding space, can be generated in a simple way without substantially disturbing the laminar directed flow in the unloading space 14.

In the area of the transfer point, the corresponding wall of the unloading space 14 is provided with a transfer opening (not shown), through which the carriers 1 are transported by the gripping unit 26 into the unloading space. In the exemplary embodiment shown, the transfer point 24 is open in the direction of the transport carriage 17. Owing to the positive pressure in the unloading space 14, the air flows through the transfer opening in the wall facing the transfer point 24, the air flowing from top to bottom out of the container thereby being correspondingly deflected. This reliably prevents contaminated air reaching the semiconductor wafers 2 from the surrounding space during the transfer operation described.

In the case of another embodiment (not shown), 5 the transfer point 24 is surrounded by side walls, of which the side wall facing the transport carriage 17 has a transfer opening, in order that the container can be brought from the transport carriage into the transfer point. This transfer opening is preferably closable and is closed after bringing the container into the transfer point 24. The air flowing out of the container has the effect of then building up a positive pressure in the transfer point 24, relative to the pressure in the surrounding space. The transfer point 24 is closed at the top by the raised container (FIG. 2). This positive pressure in the transfer point 24 is equal to or approximately equal to the positive pressure in the unloading space 14. Consequently, the container need no longer be sealed off from the side walls of the transfer point 24 and the neighboring wall 35 of the unloading space 14. Owing to the positive pressure, the clean air flows in the gap between the container and the corresponding wall of the unloading space 14 on all sides to the outside and thereby prevents the access of contaminated air from the surrounding space. Consequently, no special sealing measures have to be provided. Owing to this outwardly directed flow on all sides, a particle-free transfer zone is formed, so that the semiconductor wafers 2 can be brought out of the container into the unloading space 14, and vice versa, without risk of contamination.

Instead of the gripping unit 26, any other suitable transport device may be used in order to transport the carriers 1 into the unloading space 14 and out of it. Since the container does not have any bottom, nor are corresponding opening and closing mechanisms necessary in the process apparatus 13, the carriers 1 can be removed immediately from the container, from the opened side.

Figure 4:
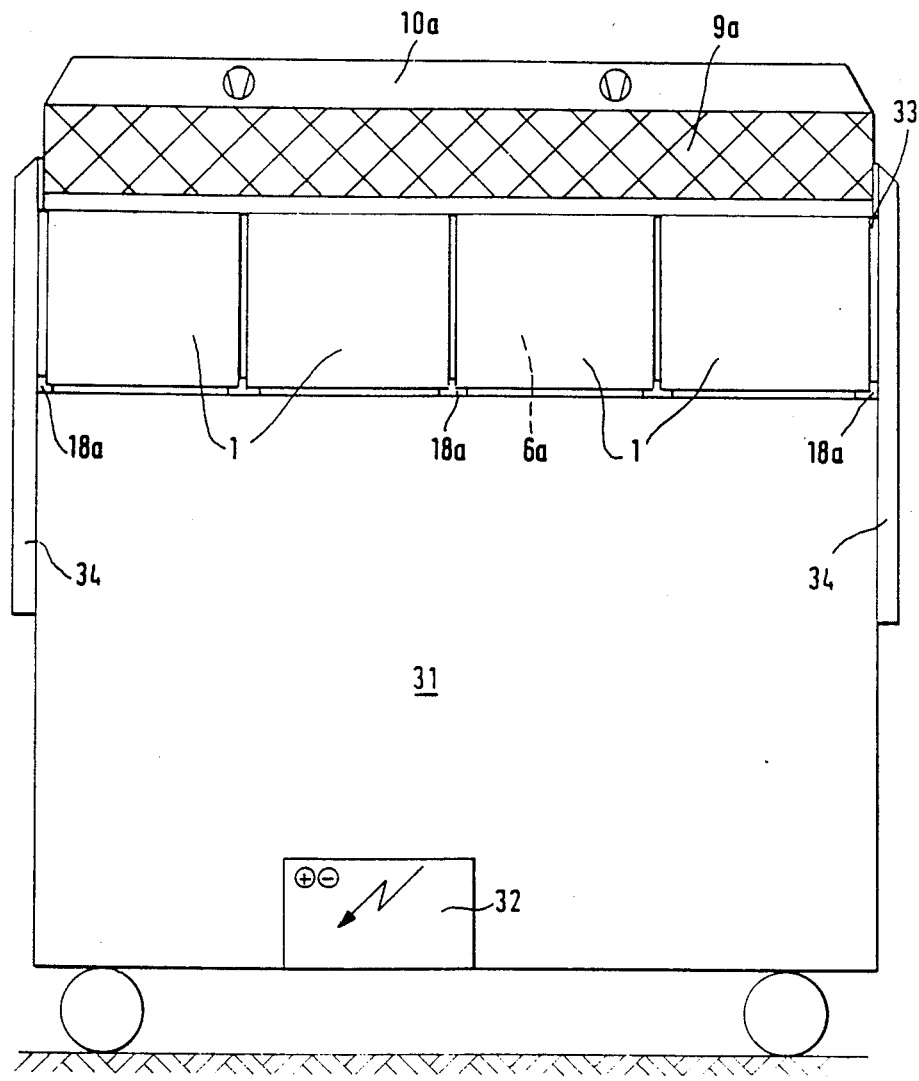
FIG. 4 shows, in diagrammatic representation, a second embodiment of a container according to the invention.

FIG. 4 shows a second embodiment of a container, which is of larger design and is mobile. The container is designed as a transport carriage, by which not only one, but several carriers 1 with semiconductor wafers can be transported. The carriers 1 in turn rest on bearings 18a, which are of the same design as the bearings 18 according to FIG. 3. They are located on a transport carriage unit 31, in which an accumulator 32 for the power supply of the fan unit 10a is accommodated. The fan unit 10a expediently has several fans, so that all carriers 1 with the semiconductor wafers have the downwardly directed flow passing evenly around them. Similar to the fan unit of the above embodiment, the fan unit 10a has the same plan outline as the container. Underneath the fan unit 10a there is again at least one high efficiency suspended substance filter 9a, in which the dirt and dust particles in the air taken in are filtered. The type of high efficiency suspended substance filter 9a again depends on the degree of purity desired in the clean space 6a. In it, the carriers 1 are arranged next to one another. All semiconductor wafers (not shown) mounted in the carriers 1 have the clean air flowing around them in the manner previously described, so that a depositing of dirt or dust particles on the semiconductor wafers is reliably prevented. The carriers 1 may rest on a perforated sheet or else be mounted in suspended manner in the clean space 6a. In any case, the clean space 6a is designed in such a way that the approximately laminarly flowing clean air can flow unhindered further downwards past all of the semiconductor wafers.

The clean space 6a is designed in such a way that the semiconductor wafers in the carriers cannot be contaminated during manual unloading or during manual loading. This is achieved by the clean space 6a being designed such that the hand of the operator with the particular carrier 1 seized cannot be moved over the other carriers. The hand of the operator itself can also not reach into the area above the carriers 1. Otherwise, the dirt particles on the hand could be carried along by the flowing air in the clean room 6a and reach the semi-conductor wafers underneath. The space between the carriers 1 and the filter 9a is designed narrow enough that the hand of the operator cannot reach into this gap area. The filter 9a is also guarded against being touched or damaged. For this purpose, a perforated plate (not shown) or a rib mesh is provided on the underside of the filter 9a.

In the clean space 6a, the flow velocity is again high enough for a certain positive pressure to be formed with respect to the contaminated surrounding space. The usual value for the flow velocity in the clean space 6a is approximately 0.45 m/sec, although this can be varied.

With the transport carriage unit 31, the carriers 1 can travel to the process apparatus 13 and be brought there into the unloading space 14. Since several carriers 1 are provided in the container, the housing part 33 enclosing the clean space 6a is raised with the filter 9a and the fan units 10a, for which purpose corresponding lifting devices 34 are provided on the transport carriage unit 31. After the raising of the housing part 33, the carriers 1 may be pushed directly from the transport carriage unit 31 into the unloading space 14 of the process apparatus 13. In this case, the process apparatus no longer requires the lifting unit 25 and the gripping unit 26.

With the containers described, it is possible in a structurally simple way to transport the sensitive semiconductor wafers 2 in the processing state even through contaminated rooms. The approximately laminar flow of clean air generated in the containers ensures that all semiconductor wafers in the container have clean air flowing around them on all sides, so that any dirt or dust particles there may be in the clean space are carried along and cannot settle on the semiconductor wafers. Furthermore, the containers are of structurally simple design and do not require any special seals which would be susceptible to faults and would make handling considerably more difficult. Rather, the containers are constantly open on one side, which not only eliminates the sealing problems but also makes handling of the containers extremely simple.

Figure 5:
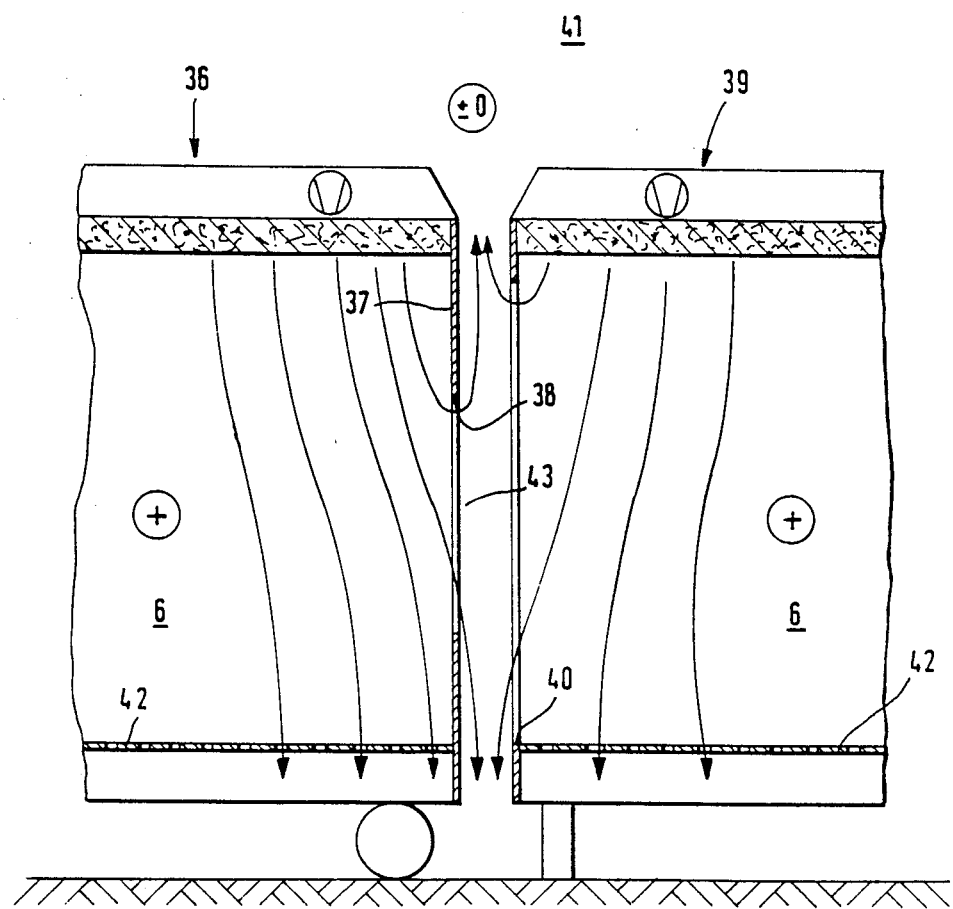
FIGS. 5 and 6 show generally diagrammatically embodiments according to the invention for transporting products between two clean air zones.

FIG. 5 shows a possibility of transferring the semiconductor wafers from one container into the other container without the transfer zone having to be sealed off from the surrounding space. The left container 36 in FIG. 5 has on its one side wall 37 a transfer opening 38. The neighboring container 39 is likewise provided with a transfer opening 40. The two transfer openings 38 and 40 may be the same size, or of different sizes, as is shown in FIG. 5. Both containers 36 and 39 have at least approximately laminar clean air flowing through them in the way described, which is indicated by arrows in FIG. 5. In the clean space 6 of these two containers, again a positive pressure is built up in the way described, relative to the positive pressure in the surrounding space 41. This positive pressure is marked in the two containers 36 and 39 by "+". The pressure in the surrounding space 41 is given in FIG. 5 by "±0". The positive pressure in the clean spaces 6 may be formed by a perforated plate 42 or another air-permeable supporting part. Underneath this perforated plate 42, the air can either flow unhindered downwards or be deflected at a bottom located at a distance underneath the perforated plate.

If, for transfer of the semiconductor wafers, the two containers 36 and 39 are brought into the position represented in FIG. 5, in which their transfer openings 38 and 40 lie alongside each other, the area surrounding these transfer openings does not have to be sealed off from the surrounding space 41. Owing to the positive pressure in both containers 36 and 39, the clean air flows in the direction of the arrows drawn on all sides along the area surrounding the transfer openings into the surrounding space 41. This achieves, in a structurally very simple way, a satisfactory sealing off of the clean spaces 6 from the surrounding space 41, i.e. no dirt particles can pass from the surrounding space 41 into the clean space 6. The positive pressures in the two clean spaces 6 are equal or at least approximately equal. Owing to the sealing described against ingress of dirt particles, a particle-free transfer zone 43 is formed between the two containers 36 and 39, in which zone the semiconductor wafers can be transferred without risk of contamination.

Instead of one or the other of containers 36 or 39, a stationary clean space with a corresponding transfer opening may also be provided. This stationary clean space may be provided at a process apparatus or may, for example, also be a walk-in large clean room.

Figure 6:
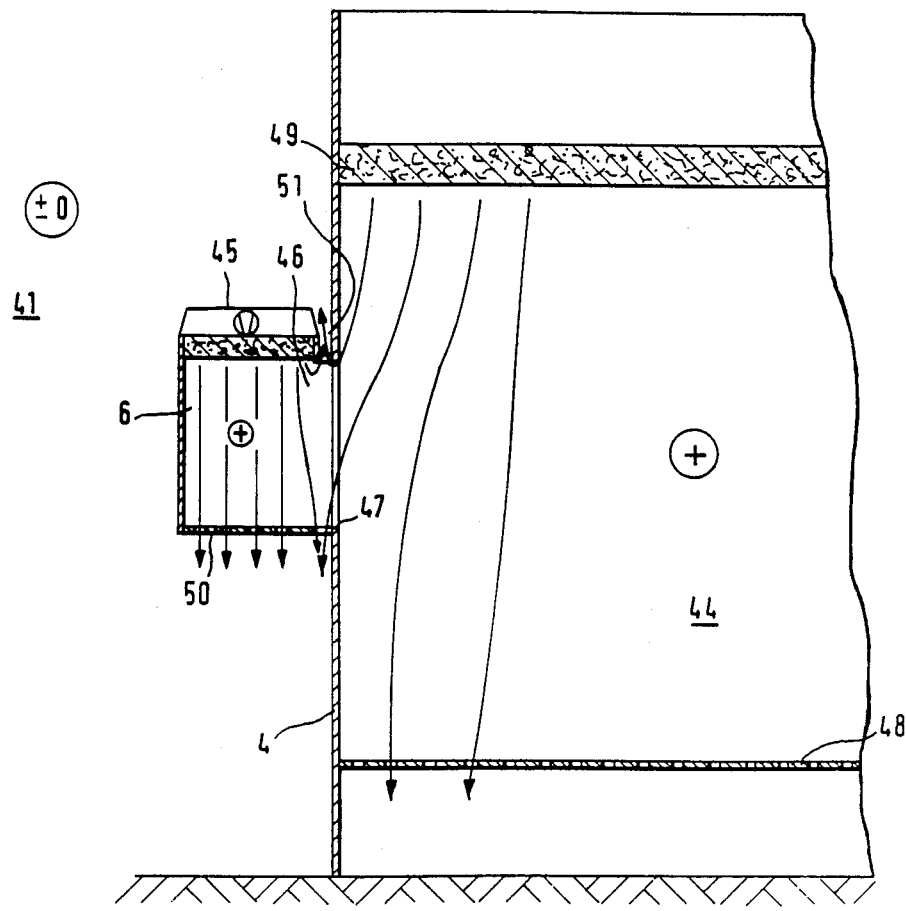

FIG. 6 shows the possibility of transferring the semiconductor wafers from a container into a walk-in clean room 44 without risk of contamination. It likewise has clean air flowing through it approximately laminarly (see arrows in FIG. 6). The container 45 is provided on one side wall with a transfer opening 46 which, in the transfer position according to FIG. 6, lies alongside a transfer opening 47 of the clean room 44. The positive pressure in the clean room 44, marked by "+", is generated by a perforated double bottom 48 or the like. The air is taken in by a fan unit (not shown) and pressed through at least one high efficiency suspended substance filter 49 into the clean room 44.

In the clean space 6 of the container 45, the positive pressure is generated in the way described by a perforated plate 50 or the like.

In the transfer position according to FIG. 6, the flow path of the clean air, indicated by arrows in FIG. 6, is achieved owing to the equal or approximately equal positive pressure in the two clean spaces 44 and 6, relative to the pressure "±0" in the surrounding space 41. The clean air flows on all sides along the rim of the transfer openings 46, 47 between the container 45 and the corresponding wall of the clean room 44 to the outside and thus prevents the access of dirt particles from the surrounding space 41 through the gap area 51 between container and clean room wall.

It is also possible to place the container directly with the open side opposite the fan unit (without perforated plate) against the respective transfer opening of the other container 39 or of the clean room 44. The transfer opening of the container is thereby formed by the open side of this container. In this case, the flow in this container is directed oppositely to the air leaving the transfer opening of the other container or of the clean room 44. In this case as well, the access of dirt particles from the surrounding space can be reliably prevented by matching of the two pressures without additional sealing measures.

The exemplary embodiments have been described with reference to semiconductor wafers 2. It goes without saying that the containers and the transfer process can also be applied everywhere where handling of articles in a clean room or under conditions appropriate for a clean room is important. For example, it is possible to use this container for medicaments, chemicals, in the field of genetic engineering, virology and the like.

What is claimed is:

1. Apparatus for the particle-free transfer of articles between a container for such articles and process apparatus including a clean room for the further processing of such articles, comprising:
   (a) carrier means for supporting said articles;
   (b) a clean air zone in said container, in which zone the carrier means and articles can be positioned;
   (c) first air circulation means for circulating an approximately laminar clean air stream through said clean air zone and past the surfaces of said articles so as to prevent contaminated particle adherence to said articles;
   (d) second air circulation means for circulating an approximately laminar clean air stream through said clean room;
   (e) said first and second air circulation means directing the respective laminar clean air streams in the same direction in said container and said clean room, and
   (f) means for transferring said carrier means with said articles from said container into said clean room in a direction transverse to the direction of laminar flow of said air stream in said container.

2. The apparatus according to claim 1, characterized in that the clean air zone in said container is formed in a clean space open in the flow direction of the clean air.

3. The apparatus according to claim 1, wherein said first air circulation means comprises at least one fan, and further includes at least one high efficiency suspended matter filter positioned at the outlet of said fan.

4. The apparatus according to claim 3, characterized in that said filter bounds the clean space on one side.

5. The apparatus according to claim 1, characterized in that said container is provided with at lest one power supply unit for operating said first air circulation means, 6. The apparatus according to claim 5, further including at least one power connection for connecting said container to a source of external power.

7. The apparatus according to claim 2, characterized in that said first air circulation means comprises a fan, and wherein a positive pressure is maintained in said clean space, relative to the pressure in the space surrounding the apparatus.

8. The apparatus according to claim 7, characterized in that clean air circulated by said fan in the clean air zone in said container has a flow velocity of approximately 0.45 m/sec.

9. The apparatus according to claim 7, further including at least one perforated plate adjacent the clean space for creating said positive pressure.

10. The apparatus according to claim 1, wherein said clean space is sufficient in volume to accommodate several carrier means.

11. The apparatus according to claim 10, wherein said transfer means comprises a transport carriage on which a plurality of containers and associated carrier means can be arranged.

12. The apparatus of claim 1, further including a loading and unloading space, and wherein said second air circulation means comprises fan means for circulating an approximately laminar clean air stream downwardly through said loading and unloading space, said first air circulation means and said fan means collectively serving to provide a clean air zone.

13. The apparatus of claim 12, wherein said loading and unloading space is open in the direction of laminar air flow.

14. The apparatus of claim 12, further including at least one high efficiency suspending substance filter for air moved by said fan means.

15. The combination of claim 14, wherein said transfer means comprises a lifting device, gripping means pivotally mounted on said lifting device and vertically movable therewith, said gripping means including a pair of gripping arms adapted to engage a carrier means supporting said articles, and means for rotating said gripping arms, and thus said carrier means, into said clean room.

* * * * *